(12) United States Patent
Cao et al.

(10) Patent No.: US 9,989,824 B2
(45) Date of Patent: Jun. 5, 2018

(54) ARRAY SUBSTRATE, DISPLAY PANEL AND DISPLAY DEVICE HAVING THE SAME, AND METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xue Cao, Beijing (CN); Xi Chen, Beijing (CN); Dong Chen, Beijing (CN); Hailin Xue, Beijing (CN); Jianyun Xie, Beijing (CN); Jian Wang, Beijing (CN); Yanchen Li, Beijing (CN); Wei Zhao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days. days.

(21) Appl. No.: 15/037,903

(22) PCT Filed: Dec. 10, 2015

(86) PCT No.: PCT/CN2015/097023
§ 371 (c)(1),
(2) Date: May 19, 2016

(87) PCT Pub. No.: WO2016/201928
PCT Pub. Date: Dec. 22, 2016

(65) Prior Publication Data
US 2017/0176825 A1 Jun. 22, 2017

(30) Foreign Application Priority Data
Jun. 16, 2015 (CN) .......................... 2015 1 0333832

(51) Int. Cl.
*H01L 27/146* (2006.01)
*G02F 1/1362* (2006.01)
(Continued)

(52) U.S. Cl.
CPC ...... *G02F 1/136209* (2013.01); *G02F 1/1368* (2013.01); *G02F 1/13439* (2013.01);
(Continued)

(58) Field of Classification Search
CPC ......... H01L 27/14623; H01L 27/14818; H01L 29/78633
See application file for complete search history.

(56) References Cited

U.S. PATENT DOCUMENTS

2003/0107687 A1 6/2003 Choo
2005/0225691 A1 10/2005 Yi et al.
(Continued)

FOREIGN PATENT DOCUMENTS

CN 1945840 A 4/2007
CN 101122694 A 2/2008
(Continued)

OTHER PUBLICATIONS

The First Office Action in the Chinese Patent Application No. 201510333832.X, dated May 17, 2017; English translation attached.
International Search Report & Written Opinion dated Mar. 23, 2016 regarding PCT/CN2015/097023.
The Second Office Action in the Chinese Patent Application No. 201510333832.X, dated Dec. 27, 2017; English translation attached.

*Primary Examiner* — Davienne Monbleau
*Assistant Examiner* — Leslie Pilar Cruz
(74) *Attorney, Agent, or Firm* — Intellectual Valley Law, P.C.

(57) ABSTRACT

The present application discloses an array substrate comprising a base substrate, a row of a plurality of pixel units, and a first gate line and a first common electrode line adjacent to the row of the plurality of pixel units and on a
(Continued)

first side of the row of the plurality of pixel units in plan view of the array substrate. The first gate line and the first common electrode line are spaced apart by a gap; and a light shield at least partially covering the gap for reducing light leakage from the gap.

20 Claims, 3 Drawing Sheets

(51) Int. Cl.
    *G02F 1/1343* (2006.01)
    *G02F 1/1368* (2006.01)

(52) U.S. Cl.
    CPC .. G02F 1/134309 (2013.01); G02F 1/136286 (2013.01); *G02F 2001/136295* (2013.01); *G02F 2201/121* (2013.01); *G02F 2201/123* (2013.01); *H01L 27/14623* (2013.01)

(56) References Cited

U.S. PATENT DOCUMENTS

| | | | |
|---|---|---|---|
| 2006/0102906 A1* | 5/2006 | Murade | G02F 1/1345 257/72 |
| 2009/0002294 A1 | 1/2009 | Horiguchi et al. | |
| 2009/0261332 A1* | 10/2009 | Shin | H01L 29/78633 257/59 |
| 2010/0207846 A1* | 8/2010 | Na | G02F 1/13624 345/55 |
| 2011/0180798 A1* | 7/2011 | Shim | G02F 1/133512 257/59 |

FOREIGN PATENT DOCUMENTS

| | | |
|---|---|---|
| CN | 101866084 A | 10/2010 |
| CN | 103941499 A | 7/2014 |
| CN | 104597643 A | 5/2015 |
| CN | 104880852 A | 9/2015 |

* cited by examiner

ARRAY SUBSTRATE, DISPLAY PANEL AND DISPLAY DEVICE HAVING THE SAME, AND METHOD THEREOF

CROSS-REFERENCE TO RELATED APPLICATION

This application is a national stage application under 35 U.S.C. § 371 of International Application No. PCT/CN2015/097023 filed Dec. 10, 2015, which claims priority to Chinese Patent Application No. 201510333832.X, filed Jun. 16, 2015, the contents of which are incorporated by reference in the entirety.

FIELD

The present invention relates to display technology, mare particularly, to, an array substrate, a display panel and a display device having the same, and a manufacturing method thereof.

BACKGROUND

Liquid crystal display panel has found a wide variety of applications. Typically, a liquid crystal display panel includes a color filter substrate and an array substrate facing each other. Thin film transistors, gate lines, data lines, pixel electrodes, common electrodes, and common electrode lines are disposed on the array substrate and color filter substrate. Between the two substrates, a liquid crystal material is injected to form a liquid crystal layer. One common problem associated with the liquid crystal display panel is light leakage. To prevent light leakage, a black matrix is placed on the color filter substrate. A liquid crystal display panel having a larger black matrix can better prevent light leakage. However, an, aperture ratio of the liquid crystal display device is reduced by using a black matrix with a larger area.

SUMMARY

In one aspect, the present invention provides an array substrate, comprising a base substrate; a row of a plurality of pixel units; and a first gate line and a first common electrode line adjacent to the row of the plurality of pixel units and on a first side of the row of the plurality of pixel units in plan view of the array substrate. The first gate line and the first common electrode line are spaced apart by a gap. The array substrate further comprises a light shield at least partially covering the gap for reducing light leakage from the gap.

Optionally, the light shield is above the gap.

Optionally, the light shield is below, the gap.

Optionally, the light shield has a width which is substantially equal to a width of the gap and less than a total width of the gap, the first gate line end the first common electrode line.

Optionally, the array substrate further comprises a first layer comprising the first gate line the first common electrode line and a second layer comprising the light shield.

Optionally, each of the plurality of pixel units comprises a thin fill a transistor comprising a gate electrode, an active layer, a source electrode, and a drain electrode; the first layer further comprising the gate electrode connected to the first gate line; the second layer comprising the light shield, the source electrode and the drain electrode.

Optionally, each of the plurality of pixel units comprises a pixel electrode above the light shield, the pixel electrode substantially completely covers the light shield in plan view of the array substrate.

Optionally, each of the plurality of pixel unit comprises a common electrode below the first gate line and the first common electrode line, and connected to the first common electrode line.

Optionally, each of the plurality of pixel units comprises a pixel electrode on top of a common electrode, the common electrode is, above the light shield, the common electrode substantially completely covers the light shield in plan view of the array substrate.

Optionally, each of the plurality of pixel units comprises a common electrode on top of a pixel electrode, the pixel electrode is above the light shield, the pixel electrode substantially completely covers the light shield in plan view of the array substrate.

In another aspect, the present invention also pay vides a display panel comprising an array substrate described herein.

In another aspect, the present invention also provides a display device comprising display panel described herein.

In another aspect, the present invention further provides a method of manufacturing rasa array substrate comprising forming a row of a plurality of pixel unitson a base substrate; forming a first gate line and a first common electrode lines adjacent to the row of the plurality of pixel units and on a first side of the row of the plurality of pixel units in plan view of the base substrate, wherein the first gate line and the first common electrode line are spaced apart by a gap; and forming a light shield, wherein the light shield at least partially covers the gap for reducing light leakage from the gap.

Optionally, the light shield is above the gap.

Optionally, the light shield is below the gap.

Optionally, the gate line and the common electrode line are made of a same material and formed in a first patterning process in a first layer, and the light shield is formed in a second patterning process in a second layer.

Optionally, the step of forming the row of the plurality of pixel units comprises forming a thin film transistor, comprising forming a gate electrode; forming an active layer; and forming a source electrode and a drain electrode. The gate electrode, the gate line, and the common electrode line are made of a same material and formed in the first patterning process; the light shield, the source electrode and the drain electrode are formed in the second patterning process.

Optionally, the step of forming the row of the plurality of pixel units further comprises forming a pixel electrode, the pixel electrode is above the light shield, the pixel electrode substantially completely covers the light shield in plan view of the array substrate.

Optionally, the step of forming an array of a plurality of pixel units further comprises forming a pixel electrode and a common electrode. The common electrode is on top of the pixel electrode, the pixel electrode is above the light shield, the pixel electrode substantially completely covers the light shield in plan view of the array substrate.

Optionally, the step of forming an array of a plurality of pixel units further comprises forming a pixel electrode and a common electrode. The pixel electrode is on top of the common electrode, the common electrode is above the light shield, the common electrode substantially completely covers the light shield in plan view of the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended, to be exhaustive or to be limited to the precise form disclosed.

Figure 1:
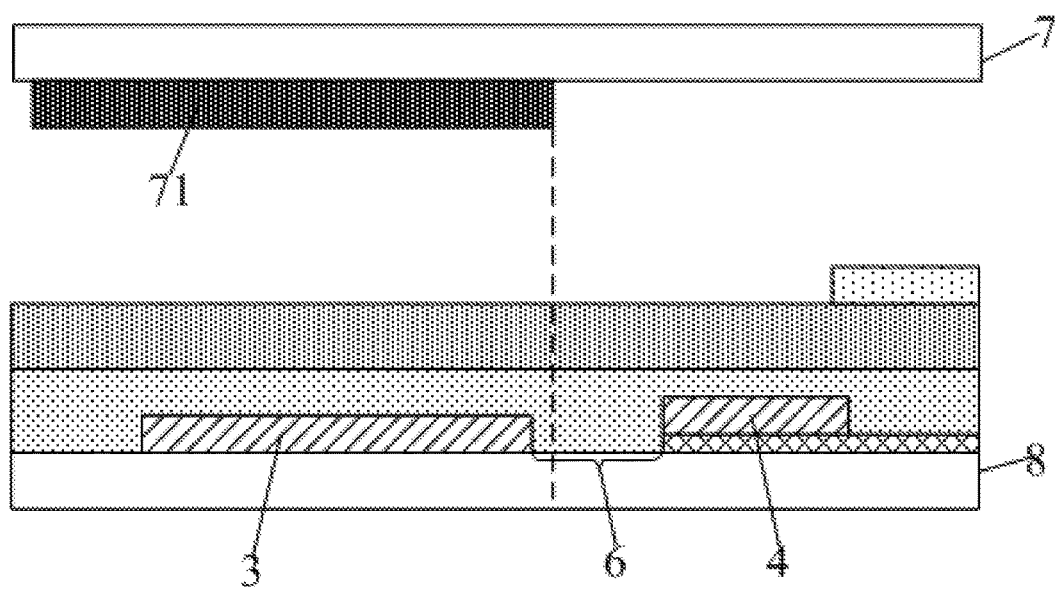
FIG. 1 is a cross-sectional view of a conventional liquid crystal display panel.

FIG. 1 is a cross-sectional view of a conventional liquid crystal display panel. The conventional liquid crystal display panel includes a color filter 7 and an array substrate 8. Referring to FIG. 1, the array substrate 8 in a conventional display panel includes a plurality of gate lines 3 and a plurality of common electrode lines 4. The gate lines 3 and the common electrode lines 4 are parallel to each other and are spaced apart by a gap 6. Light leakage occurs in the gap 6 between the gate line 3 and the common electrode line 4. In a conventional display panel, as shown in FIG. 1, light leaking out from the gap 6 sometimes cannot be blocked by a black matrix 71. For example, in response to external pressure placed on the color filter 7, the color filter 7 of the display panel may shift relative to the array substrate 8, resulting in light passing through.

Figure 2:
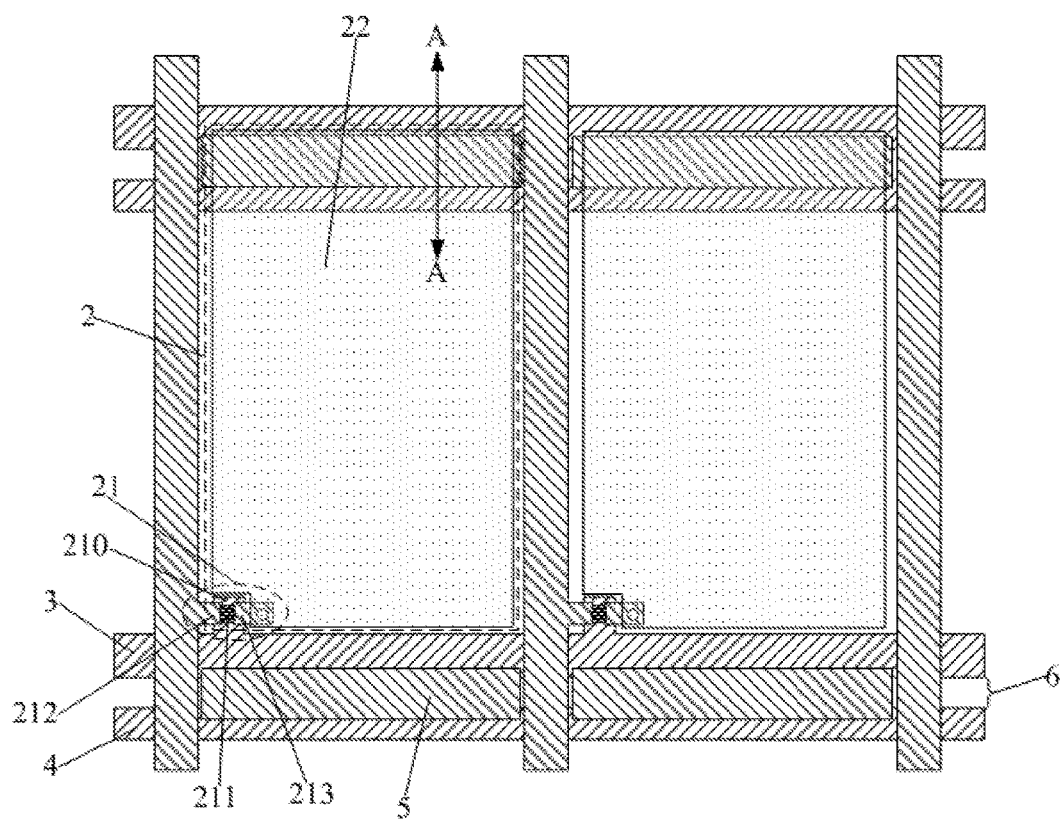
FIG. 2 is a diagram illustrating the structure of an array substrate in plan view in an embodiment.
Figure 3A:
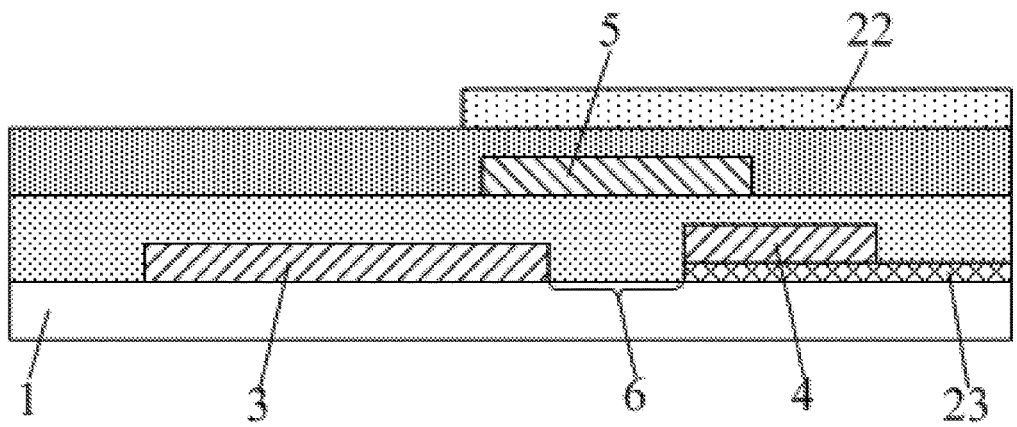
FIGS. 3A and 3B are cross-section views of the array substrate taken along section line A-A of FIG. 2.
Figure 3B:
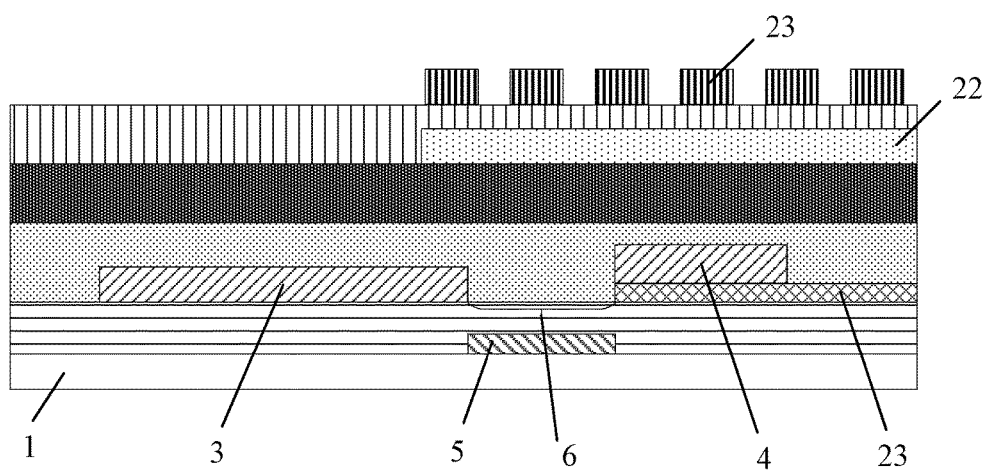

FIG. 2 is a diagram illustrating the structure of an array substrate in plan view in an embodiment. FIGS. 3A and 3B are cross-section views of the array substrate taken along section line A-A of FIG. 2. Referring to FIGS. 2, 3A, and 3B, the array substrate in the embodiment includes a base substrate 1, an array of a plurality of pixel units 2 disposed on the base substrate 1, a plurality of gate lines 3, a plurality of common electrode lines 4, and a plurality of light shields 5. The gate lines 3 define rows of pixel units 2. Each row of the plurality of pixel units 2 corresponds to one gate line 3 (i.e., a first gate line 3) and one common electrode line 4 (i.e., a first common electrode line 4). The first gate line 3 and the first common electrode line 4 are adjacent to and are on a same side of the row of the plurality of pixel units 2 in plan view of the array substrate. The first gate line 3 and the first common electrode line 4 are spaced apart by a gap 6. The light shield 5 is disposed on the base substrate at a position corresponding to the gap 6 between the first gate line 3 and the first common electrode line 4 (e.g., above or below the gap 6). In FIG. 3A, the light shield 5 is disposed on top of the gap 6 to reduce light leakage from the gap 6. In FIG. 3B, the light shield 5 is disposed below the gap 6 to reduce light leakage from the gap 6. The projection of light shield 5 covers the gap 6 in plan view of the array substrate. By covering the gap 6 between the first gate line 3 and the first common electrode line 4 with a light shield 5, light leakage can be reduced or eliminated. In some embodiments, the light shield 5 at least partially covers the gap 6 for reducing light leakage from the gap 6.

In some embodiments, the light shield 5 has a width which is equal to or larger than a width of the gap 6 but less than the total width of the gap 6, the first gate line 3 and the first common electrode line 4 altogether. A light shield 5 having such a width can effectively prevent light leakage in the gap 6. At the same time, the light shield 5 having such a width, minimally affects light transmission in light transmitting areas of the array substrate. Consequently, the aperture ratio of the display panel is not compromised by having a light shield 5. Optionally, the width of the light shield 5 equals to the width of the gap 6, in some embodiments, the width of the light shield 5 is less than the width of the gap 6 hut still allows sufficient reduction of light leakage in the gap 6. In some embodiments, the width of the light shield 5 is larger than (e.g., slightly larger) the total width of the gap 6, the first gate line 3 and the first common electrode line 4 to ensure complete light blocking. Optionally, the array substrate includes a first layer having the first gate line 3 and the first common electrode line 4, and a second layer having the light shield 5. The second layer having the light shield 5 can be disposed either above or below the first layer having the first gate line 3 and the first common electrode line 4.

As used herein, the term "same layer" refers to the relationship between the layers simultaneously formed in the same step. In one example, two electrodes are on the same layer when the two electrodes are formed as a result of one or more steps of a same patterning process performed on a same layer of material. In another example, the first gate line 3 and the first common electrode line 4 can be formed in the same layer by simultaneously performing the step of forming the first gate line 3 and the step of forming the first common electrode line 4. The term "same layer" does not always mean that the thickness of the layer or the height of the layer in a cross-sectional view is the same.

Referring to FIG. 2, the pixel unit 2 in the embodiment includes a thin film transistor 21. The thin film transistor 21 includes a gate electrode 210, an active layer 211, a source electrode 212, and a drain electrode 213. The gate electrode 240 and the first gate line 3 are connected to each other. Optionally, the first layer includes the gate electrode 210, the first gate line 3, and the first common electrode line 4. Optionally, the second layer includes the light shield 5, the source electrode 212 and the drain electrode 213 made, of a same material. Accordingly, the source electrode 212, the drain electrode 213, and/or the light shield 5 can be formed in a same patterning process. The thin film transistor 21 as shown in can be a bottom gate type thin film transistor (as shown in FIG. 2) or a top gate type thin film transistor. The second layer can be disposed above the first layer (as shown in FIG. 2) or below the first layer.

Optionally, the light shield 5 is integrally formed as a single body with the drain electrode 213 of the thin film transistor 21. For example, the light shield 5 can be formed by extending the drain electrode pattern to the area corresponding to the gap 6.

In the embodiment as shown in FIGS. 2, 3A, and 3B, the light shield 5 has a width which is equal to (FIG. 3B) or larger than (FIG. 3A) a width of the gap 6 but less than the total width of the gap 6, the first gate line 3 and the first common electrode line 4 altogether. The light shield 5 partially overlaps with the first gate line 3 and the first common electrode line 4, and forms capacitance with them. During image display, the voltages on the first gate line 3 and the first common electrode line 4 induce an electrical field with the light shield 5. The induced electrical field causes disturbance in the liquid crystal layer of the display panel.

Referring to FIGS. 2, 3A, and 3B, the pixel unit in the embodiment further includes a pixel electrode 22 above the light shield 5. For example, the pixel electrode 22 can be on top of the light shield 5 to shield the liquid crystal layer from electrical field induced by the light shield 5. To optimize the electrical field shielding effect, the pixel electrode 22 may be disposed to substantially completely cover the light shield 5 in plan view of the array substrate. By having a pixel electrode 22 that substantially completely covers the light shield 5, the induced electrical field can be effectively shielded. The disturbance in the liquid crystal layer can be effectively reduced or eliminated, thereby enhancing display quality.

Referring to FIGS. 2, 3A, and 3B, the pixel unit in the embodiment further includes a common electrode 23 below the first gate line 3 and the first common electrode line 4, and connected to the first common electrode line 4.

Optionally, the pixel unit in the embodiment further includes a common electrode 23 disposed at a position corresponding to the pixel electrode 22. The common electrode 23 are disposed on top of the pixel electrode 22 (see, e.g., FIG. 3B). Each of the plurality of pixel electrodes 22 is above each of the light shield 5. For example, each of the pixel electrodes 22 can be on top of each of the plurality of light shields 5 to shield the liquid crystal layer from electrical field induced by the light shield 5. To optimize the electrical field shielding effect, each of the plurality of pixel electrodes 22 may be disposed to substantially completely cover each of the plurality of light shields 5 in plan view of the array substrate. Optionally, the light shields 5 are above the first layer having the gate lines 3 and the common electrode lines 4. Optionally, the light shields 5 are below the first layer having the gate lines 3 and the common electrode lines 4.

Optionally, the pixel unit in the embodiment further includes a common electrode 23 disposed at a position corresponding to the pixel electrode 22. The pixel electrode 22 are disposed on top of the common electrode 23. Each of the plurality of common electrodes 23 is above each of the light shield 5 (see, e.g., FIG. 3B). For example, each of the common electrodes 23 can be disposed on top of each of the plurality of light shields 5 to shield the liquid crystal layer from electrical field induced by the light shield 5. To optimize the electrical field shielding effect, each of the plurality of common electrodes 23 may be disposed to substantially completely cover each of the plurality of light shields 5 in plan view of the array substrate. Optionally, the light shields 5 are disposed above the layer having the gate lines 3 and the common electrode lines 4. Optionally, the light shields 5 are disposed below the layer having the gate lines 3 and the common electrode lines 4.

The array substrate in the embodiment is an Advanced Super Dimension Switch (ADS) mode array substrate. In an ADS mode display panel, the color filter is prone to shift relative to the array substrate in response to external pressure. As a result, the black matrix on the color filter also shifts relative to the array substrate, and no longer covers the gap area 6 between the first gate line 3 and the first common electrode line 4. By covering the gap 6 between the first gate line 3 and the first common electrode line 4 with a light shield 5, light leakage can be reduced or eliminated when the leaking light cannot be blocked by the black matrix. Optionally, the array substrate may be an array substrate of other modes, e.g., a Twisted Nematic (TN) mode array substrate. In a TN mode array substrate, the common electrode 23 is disposed on the color filter.

In some embodiments, the display panel is a touch display panel, e.g., a resistive, capacitive, optical, sound wave, or electromagnetic touch display panel.

The present disclosure also provides a method of manufacturing an array substrate. In some embodiments, the method includes forming an array of pixel units, gate lines, and common electrode lines on a base substrate, and forming light shields. The plurality of gate lines defines a plurality of rows of pixel units (FIG. 2), and each row of the pixel units corresponds to one gate line (i.e., a first gate line) and one common electrode line (i.e., a first common electrode line). In some embodiments, the method includes forming a row of a plurality of pixel units on a base substrate, forming a first gate line and a first common electrode lines, and forming a light shield. The first gate line and the first common electrode line are adjacent to and are on the same side (e.g., a first side) of, a row of the pixel units in plan view of the array substrate. The first gate line and the first common electrode line are spaced apart by a gap. The light shield is disposed at a position corresponding to the gap for reducing light leakage from the gap, e.g., the projection of light shield covers the gap in plan view of the array substrate. The light shield can be disposed either above or below the layer having the first gate line and the first common electrode line. The gate lines and the common electrode lines can be made of a same material and formed in a same patterning process. In some embodiments, the light shield at least partially covers the gap for reducing light leakage from the gap.

The process of forming an array of pixel units includes a process of forming an array of thin film transistors, e.g., forming gate electrodes, active layers, source electrodes and drain electrodes. The gate electrodes and the gate lines can be made of a same material and formed in a same patterning process. Optionally, the gate lines, the common electrode lines, and the gate electrodes of the thin film transistor are all made of a same material and formed in a first patterning process (i.e., a first layer). The source electrodes and the drain, electrodes can made of a same material and formed in a same patterning process. Optionally, the light shields, the source electrodes, and the drain electrodes are all made of a same material and formed in a second patterning process (i.e., a second layer). Optionally, an insulating layer is disposed between the second layer having the light shields and the first layer having the gate lines and the common electrode lines. The first patterning process can be conducted prior to the second patterning process. As a result, the second layer is above the first layer. Alternatively, the second patterning process is conducted prior to the first, patterning process. Consequently, the second layer is below the first layer.

The process of forming pixel units also includes a process of forming pixel electrodes. In some embodiments, each of the pixel electrodes is on top of each of the light, shields, and substantially completely covers each of the corresponding light shields in plan view of the array substrate. As discussed above, the light shield partially overlaps with and forms capacitance with the gate line and the common electrode line. During image display, the voltages on the gate line and the common electrode line induce an electrical field with the light shield. By forming a pixel electrode that substantially completely covers the light shield, the induced electrical field can be effectively shielded. The disturbance in the liquid crystal layer can be effectively reduced or eliminated, thereby enhancing display quality.

Optionally, a passivation layer is disposed between the pixel electrodes and the light shields. The passivation layer may include a via through which the pixel electrode is connected to the drain electrode of the thin film transistor.

In some embodiments, the process of forming an array of pixel units includes a process of forming an array of common electrodes and forming an array of pixel electrodes. The pixel electrodes are above the light shield. For example, the pixel electrode can be disposed on top of the light shield to shield the liquid crystal layer from electrical field induced by the light shield. To optimize the electrical field shielding effect, each of the pixel electrodes may be disposed to substantially completely cover each of the light shields in plan view of the array substrate.

In some embodiments, the common electrodes are below the gate lines and the common electrode lines. Optionally, the light shields are above the gate lines and the common electrode lines. Optionally, the light shields are below the gate lines and the common electrode lines.

In some embodiments, the process of forming pixel units includes a process of forming common electrodes and forming pixel electrodes. The common electrodes are disposed on top of the pixel electrodes. Each of the plurality of pixel electrodes is above each of the light shield. For example, each of the pixel electrodes can be on top of each of the plurality of light shields to shield the liquid crystal layer from electrical field induced by the light shield. To optimize the electrical field shielding effect, each of the plurality of pixel electrodes may be disposed to substantially completely cover each of the plurality of light shields in plan view of the array substrate. Optionally, the light shields are above the first layer having the gate lines and the common electrode lines. Optionally, the light shields are below the first layer having the gate lines and the common electrode lines.

In some embodiments, the process of forming pixel units includes a process of forming common electrodes and forming pixel electrodes. The pixel electrodes are disposed on top of the common electrodes. Each of the plurality of common electrodes is above each of the light shield. For example, each of the common electrodes can be disposed on top of each of the plurality of light shields to shield the liquid crystal layer from electrical field induced by the light shield. To optimize the electrical field shielding effect, each of the plurality of common electrodes may be disposed to substantially completely cover each of the plurality of light shields in plan view of the array substrate. Optionally, the light shields are disposed above the layer having the gate lines and the common electrode lines. Optionally, the light shields are disposed below the layer having the gate lines and the common electrode lines.

The present disclosure also provides a display panel having an array substrate described herein or manufactured by a method described herein. The present disclosure further provides a display device having a display panel described herein. The display device can be of any type, e.g., a mobile phone, a laptop, a television, a display device, a computer, a digital photo album, a gps, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated, it is intended that the scope of the invention be defined by the claims appended hereto and their equivalents, in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a base substrate;
   a row of a plurality of pixel units on the base substrate, each of the plurality of pixel units comprises a common electrode, and a thin film transistor having a gate electrode; and
   a first gate line connected to the gate electrode;
   a first common electrode line connected to the common electrode; and
   a light shield;
   wherein the first gate line and the first common electrode line are adjacent to the row of the plurality of pixel units and on a first side of the row of the plurality of pixel units in plan view of the array substrate, the first gate line and the first common electrode line being spaced apart by a gap; and
   an orthographic projection of the light shield on the base substrate at least partially covers an orthographic projection of the gap on the base substrate for reducing light leakage from the gap.

2. The array substrate of claim 1, wherein the light shield is on a side of the gap distal to the base substrate.

3. The array substrate of claim 1, wherein the light shield is on a side of the gap distal to the base substrate.

4. The array substrate of claim 1, wherein the light shield has a width which is substantially equal to a width of the gap and less than a total width of the gap, the first gate line and the first common electrode line.

5. The array substrate of claim 1, comprising a first layer and a second layer different from the first layer:
   wherein the first gate line and the first common electrode line are in the first layer; and
   the light shield are in the second layer.

6. The array substrate of claim 5, wherein the thin film transistor in each of the plurality of pixel units further comprises an active layer, a source electrode, and a drain electrode;
   the gate electrode is in the first layer; and
   the source electrode and the drain electrode are in the second layer.

7. The array substrate of claim 5, wherein each of the plurality of pixel units further comprises a pixel electrode on a side of the light shield distal to the base substrate, or orthographic projection of the pixel electrode substantially covers an orthographic projection of the light shield on the base substrate in plan view of the array substrate.

8. The array substrate of claim 5, wherein the common electrode is on a side of the first gate line and the first common electrode line proximal to the base substrate.

9. The array substrate of claim 5, wherein each of the plurality of pixel units further comprises a pixel electrode on a side of a common electrode distal to the base substrate, the common electrode is on a side of the light shield distal to the base substrate, and an orthographic projection of the common electrode on the base substrate substantially covers an orthographic projection of the light shield on the base substrate in plan view of the array substrate.

10. The array substrate of claim 5, wherein each of the plurality of pixel units further comprises a pixel electrode, the common electrode is on a side of the pixel electrode distal to the base substrate, the pixel electrode is on a side of the light shield distal to the base substrate, and an orthographic projection of the pixel electrode on the base substrate substantially covers an orthographic projection of the light shield on the base substrate in plan view of the array substrate.

11. A display panel comprising an array substrate of claim 1.

12. The array substrate of claim 1, wherein the light shield has a width which is less than a total width of the gap, the first gate line and the first common electrode line.

13. The array substrate of claim 1, wherein the light shield has a width which is greater than a width of the gap, and less than a total width of the gap, the first gate line and the first common electrode line.

14. A method of fabricating an array substrate, comprising:
    forming a row of a plurality of pixel units on a base substrate, each of the plurality of pixel units is formed to comprise a common electrode, and a thin film transistor having a gate electrode;
    forming a first gate line connected to the gate electrode;
    forming a first common electrode line connected to the common electrode; and
    forming a light shield;
    wherein the first gate line and the first common electrode line are formed adjacent to the row of the plurality of pixel units and on a first side of the row of the plurality of pixel units in plan view of the base substrate, the first gate line and the first common electrode line are formed spaced apart by a gap; and the light shield is formed so that an orthographic projection of the light shield on the base substrate at least partially covers an orthographic projection of the gap on the base substrate for reducing light leakage from the gap.

15. The method of claim 14, wherein the light shield is formed on a side of the gap distal to the base substrate.

16. The method of claim 14, wherein the first gate line and the first common electrode line are made of a same material and formed in a first patterning process in a first layer, and the light shield is formed in a second patterning process in a second layer.

17. The method of claim 16, wherein the thin film transistor is formed to further comprise an active layer, a source electrode, and a drain electrode;
    the gate electrode, the first gate line, and the first common electrode line are made of a same material and formed in the first patterning process; and
    the light shield, the source electrode and the drain electrode are formed in the second patterning process.

18. The method of claim 16, wherein each of the plurality of pixel units is formed to further comprise a pixel electrode;
    the pixel electrode is formed above the light shield, the pixel electrode is formed so that an orthographic projection of the pixel electrode on the base substrate substantially covers an orthographic projection of the light shield on the base substrate in plan view of the array substrate.

19. The method of claim 16, wherein each of the plurality of pixel units is formed to further comprise a pixel electrode;
    wherein the common electrode is formed on a side of the pixel electrode distal to the base substrate, the pixel electrode is formed on a side of the light shield distal to the base substrate, the pixel electrode is formed so that an orthographic projection of the pixel electrode on the base substrate substantially covers an orthographic projection of the light shield in plan view of the array substrate.

20. The method of claim 16, wherein each of the plurality of pixel units is formed to further comprise a pixel electrode;
    wherein the pixel electrode is formed on a side of the common electrode distal to the base substrate, the common electrode is formed on a side of the light shield distal to the base substrate, the common electrode is formed so that an orthographic projection of the common electrode on the base substrate substantially covers an orthographic projection of the light shield in plan view of the array substrate.

* * * * *